(12) United States Patent
Kim

(10) Patent No.: US 11,810,865 B2
(45) Date of Patent: Nov. 7, 2023

(54) SEMICONDUCTOR PACKAGE WITH MARKING PATTERN

(71) Applicant: SAMSUNG ELECTRONICS CO., LTD., Suwon-si (KR)

(72) Inventor: Seungmin Kim, Asan-si (KR)

(73) Assignee: Samsung Electronics Co., Ltd.

( * ) Notice: Subject to any disclaimer, the term of this patent is extended or adjusted under 35 U.S.C. 154(b) by 138 days.

(21) Appl. No.: 17/381,274

(22) Filed: Jul. 21, 2021

(65) Prior Publication Data
US 2022/0165678 A1    May 26, 2022

(30) Foreign Application Priority Data
Nov. 23, 2020    (KR) .................... 10-2020-0157884

(51) Int. Cl.
| H01L 23/544 | (2006.01) |
| H01L 25/065 | (2023.01) |
| H01L 23/29  | (2006.01) |
| H01L 23/18  | (2006.01) |

(52) U.S. Cl.
CPC .......... *H01L 23/544* (2013.01); *H01L 23/18* (2013.01); *H01L 23/295* (2013.01); *H01L 25/0657* (2013.01); *H01L 2223/5442* (2013.01); *H01L 2225/0651* (2013.01); *H01L 2225/06506* (2013.01); *H01L 2225/06562* (2013.01)

(58) Field of Classification Search
CPC ............................................. H01L 2225/06562
See application file for complete search history.

(56) References Cited

U.S. PATENT DOCUMENTS

| 6,322,903 | B1 | 11/2001 | Siniaguine et al. |
| 9,570,405 | B2 | 2/2017 | Tomohiro |
| 10,096,553 | B2 | 10/2018 | Su et al. |
| 2007/0035008 | A1 | 2/2007 | Wu et al. |
| 2010/0084758 | A1 | 4/2010 | Mun |
| 2014/0175657 | A1 | 6/2014 | Oka et al. |
| 2015/0380359 | A1 | 12/2015 | Lim |
| 2020/0135656 | A1 | 4/2020 | Zhou et al. |
| 2021/0407965 | A1* | 12/2021 | Kim .................... H01L 25/50 |

FOREIGN PATENT DOCUMENTS

KR       100515101 B1    9/2005

* cited by examiner

*Primary Examiner* — Yu-Hsi D Sun
(74) *Attorney, Agent, or Firm* — Fish & Richardson P.C.

(57) ABSTRACT

A semiconductor package includes; a chip structure including vertically stacked semiconductor chips disposed on a package substrate, a spacer disposed on an uppermost semiconductor chip among the semiconductor chips, an encapsulant covering at least part of the chip structure, and including an upper portion of the encapsulant covering at least part of the spacer, and a marking pattern visually identifiable through an opening in the upper portion of the encapsulant selectively exposing portions of the spacer.

19 Claims, 8 Drawing Sheets

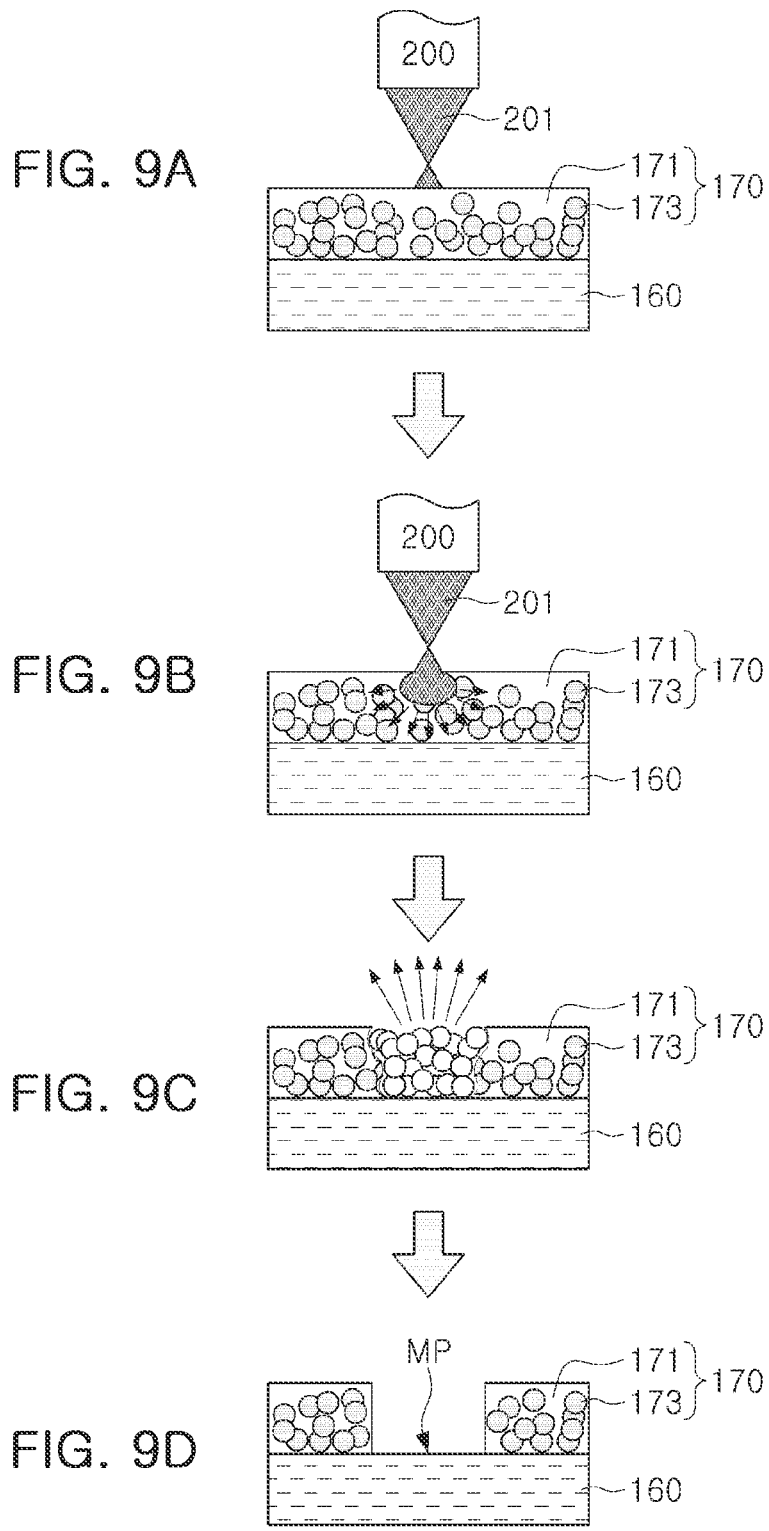

SEMICONDUCTOR PACKAGE WITH MARKING PATTERN

CROSS-REFERENCE TO RELATED APPLICATION

This application claims priority from Korean Patent Application No. 10-2020-0157884 filed on Nov. 23, 2020 in the Korean Intellectual Property Office, the subject matter of which is hereby incorporated by reference.

BACKGROUND

1. Field

The inventive concept relates generally to semiconductor packages.

2. Description of Related Art

Consistent with trends towards greater device functionality and increased miniaturization of components, multiple semiconductor chips may be stacked within a single semiconductor package.

SUMMARY

Embodiments of the inventive concept provide semiconductor packages providing improved overall reliability.

According to one aspect of the inventive concept, a semiconductor package may include; a package substrate, a chip structure including vertically stacked semiconductor chips disposed on the package substrate, a spacer disposed on an uppermost semiconductor chip among the semiconductor chips, an encapsulant covering at least part of the chip structure, and including an upper portion of the encapsulant covering at least part of the spacer, and a marking pattern visually identifiable through an opening in the upper portion of the encapsulant selectively exposing portions of the spacer.

According to another aspect of the inventive concept, a semiconductor package may include; a package substrate, a support member disposed on the package substrate, a chip structure including a first semiconductor chip disposed on the package substrate, and second semiconductor chips vertically stacked on at least one of the first semiconductor chip and the support member, a spacer disposed on an uppermost second semiconductor chip among the second semiconductor chips, an encapsulant covering at least part of the chip structure, and including an upper portion of the encapsulant covering at least part of the spacer, and a marking pattern visually identifiable through an opening in the upper portion of the encapsulant selectively exposing portions of the spacer, wherein a distance from an uppermost surface of the chip structure to an uppermost surface of the encapsulant ranges from between about 40 µm to about 150 µm.

According to another aspect of the inventive concept, a semiconductor package may include; A semiconductor package, comprising:
 a package substrate;
 a chip structure including vertically stacked semiconductor chips disposed on the package substrate;
 a spacer disposed on the chip structure, and including a first surface, facing the chip structure, and a second surface opposing the first surface;
 an upper adhesive layer between the first surface of the spacer and an upper surface of an uppermost semiconductorchip among the semiconductor chips;
 an encapsulant covering at least part of the chip structure, and including an upper portion of the encapsulant covering at least part of the spacer; and
 a marking pattern visually identifiable through an opening in the upper portion of the encapsulant selectively exposing portions of the second surface of the spacer,
 wherein the spacer includes a silicon layer, and
 the encapsulant includes a resin and a filler.

BRIEF DESCRIPTION OF DRAWINGS

The above and other aspects, features, and advantages of the present inventive concept will be more clearly understood from the following detailed description taken in conjunction with the accompanying drawings, in which:

FIG. 9, inclusive of FIGS. 9(a), 9(b), 9(c) and 9(d), is a cross-sectional view illustrating in one example a marking process that may be used in conjunction with semiconductor packages according to embodiments of the inventive concept.

DETAILED DESCRIPTION

Hereinafter, certain embodiments of the inventive concept will be described in some additional detail with reference to the accompanying drawings.

Throughout the written description and drawings, like reference numbers and labels will be used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay, etc.

Figure 1:
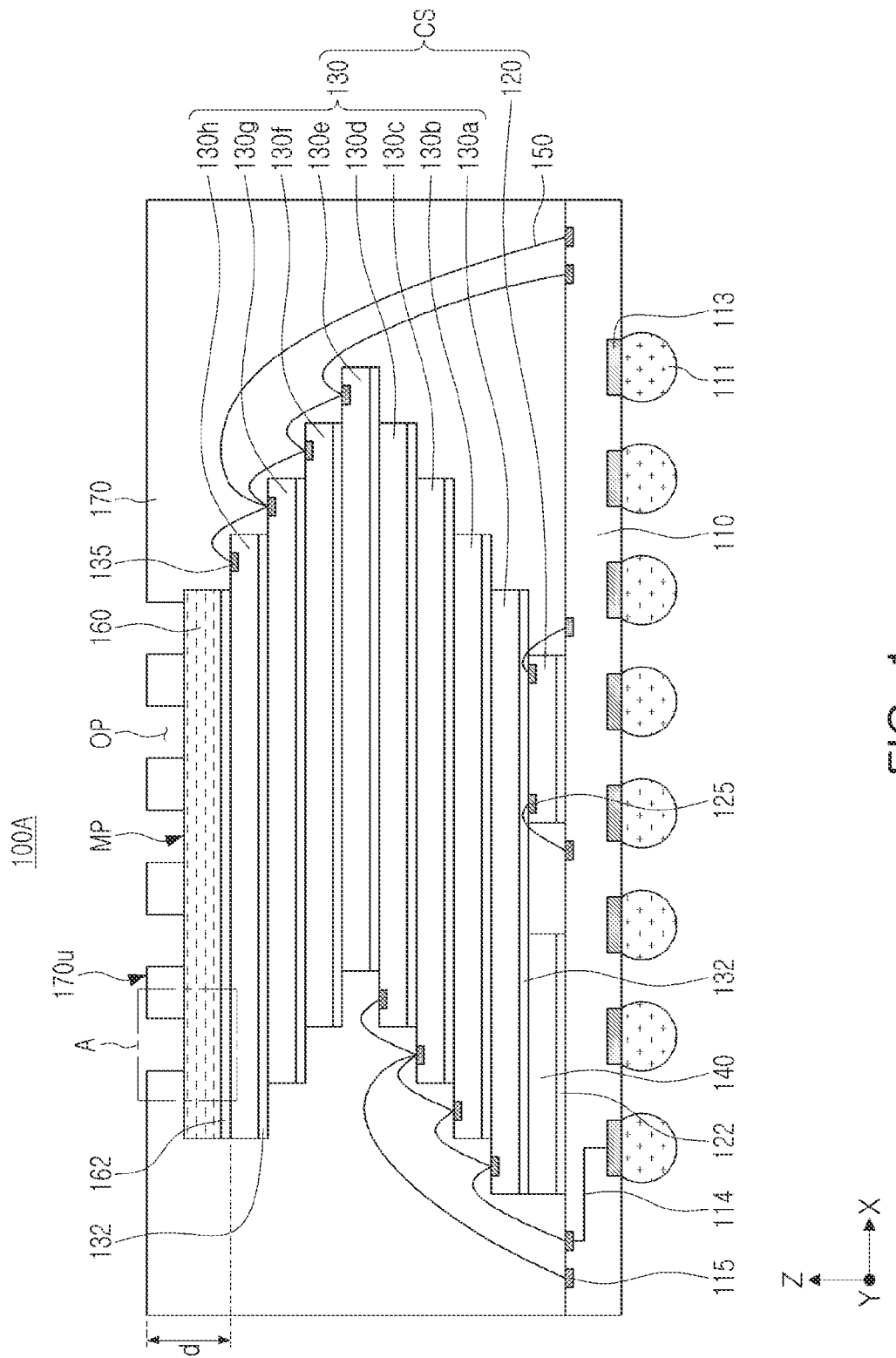
FIG. 1 is a cross-sectional diagram illustrating a semiconductor package according to embodiments of the inventive concept.
Figure 2:
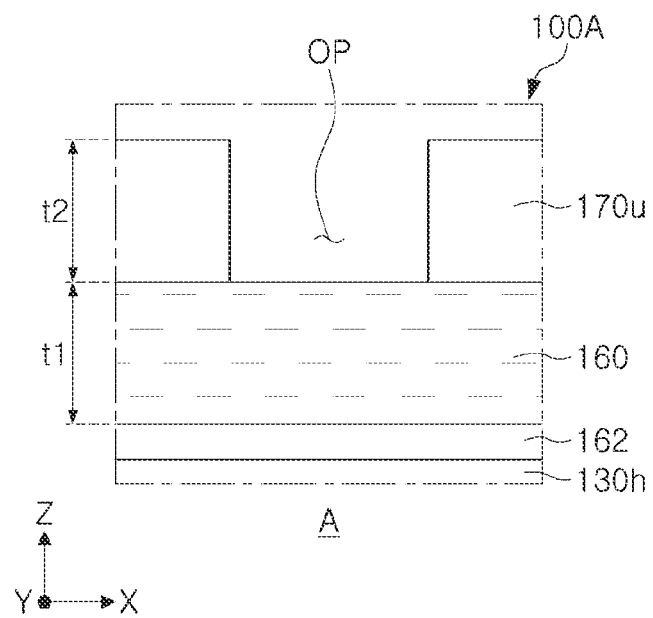
FIG. 2 is an enlarged cross-sectional view illustrating area 'A' indicated in FIG. 1.
Figure 3:
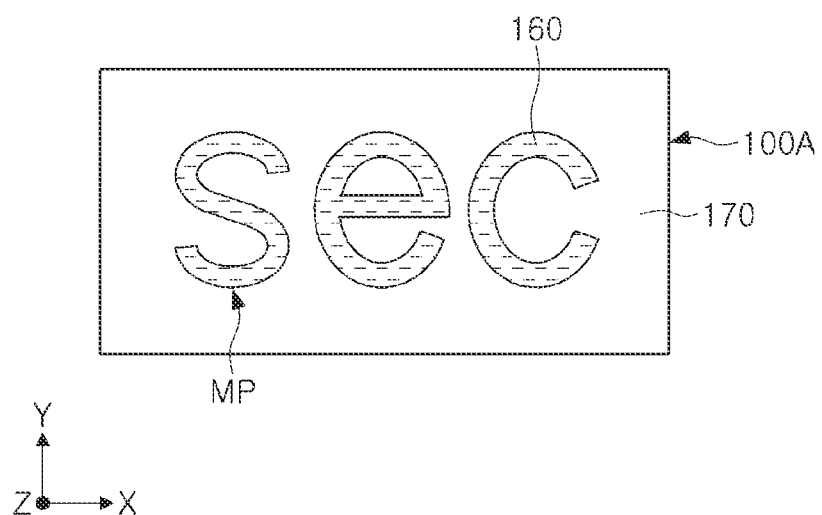
FIG. 3 is a plan view illustrating in one example a semiconductor package according to embodiments of the inventive concept.

FIG. 1 is a cross-sectional view of a semiconductor package 100A according to embodiments of the inventive concept, FIG. 2 is an enlarged cross-sectional view of area 'A' indicated in FIG. 1, and FIG. 3 is a plan (or top-down) view further illustrating a marking pattern MP for a semiconductor package according to embodiments of the inventive concept.

Referring collectively to FIGS. 1, 2 and 3, the semiconductor package 100A may include a package substrate 110, a chip structure CS, adhesive layers 122 and 132, a bonding wire 150, and a spacer 160, an encapsulant 170 and a marking pattern MP. In some embodiments, the semiconductor package 100A may optionally include a connection terminal(s) 111 and/or support member(s) 140.

The package substrate 110 may be variously implemented as (e.g.) a printed circuit board (PCB), a ceramic substrate, a tape wiring board, etc. In some embodiments, the package substrate 110 may include a thermosetting resin such as an epoxy resin, a thermoplastic resin such as polyimide, and/or a photosensitive insulating layer. In this regard, the package substrate 110 may include one or more of an Ajinomoto Build-up Film (ABF), FR-4, Bismaleimide Triazine (BT), a Photo Imagable Dielectric resin (PID), and the like.

In the illustrated example of FIG. 1, lower connection pads 113 may be disposed on a lower surface of the package substrate 110 and/or upper connection pads 115 may be disposed on an upper surface of the package substrate 110. Internal wiring 114 may variously and electrically connect one or more lower connection pads 113 and one or more upper connection pads 115 with other internal or external components. In this regard, the lower connection pads 113, the upper connection pads 115, and the internal wiring 114 may include one or more conductive materials, such as metal, metal nitride, conductive carbon, or a combination thereof.

When provided, the connection terminal(s) 111 may be disposed below the package substrate 110. In some embodiments, one or more of the connection terminals 111 may be connected to respective ones of the lower connection pads 113. Here, the connection terminal(s) 111 may be used to electrically connect various circuitry within the semiconductor package 100A to and external device (e.g., a main board). Those skilled in the art will appreciate that the connection terminal(s) 111 may be provided using a flip-chip connection structure including solder ball(s), conductive bump(s), and/or grid array(s), such as a pin grid array, a ball grid array and a land grid array.

The chip structure CS will vary by design, but will typically include multiple semiconductor chips (e.g., the vertically stacked (e.g., in the Z direction) semiconductor chips 120, 130a, 130b, 130c, 130d, 130e, 130f, 130g, and 130h—hereafter collectively, "130a to 130h") shown in FIG. 1). For one example, the chip structure CS may include a first-type semiconductor chip 120 (e.g., one or more of a logic chip, a control chip, a large scale integration (LSI) chip, a Complementary Metal Oxide Semiconductor (CMOS) imaging sensor (CIS), etc.) and at least one second-type semiconductor chip 130 (e.g., a memory chip). In other examples, the semiconductor chip structure CS may include multiple semiconductor chips having a same type. Hereafter for ease of description, a chip structure CS is assumed that includes a first semiconductor chip 120 and multiple second semiconductor chips 130.

However specifically configured, the chip structure CS may be disposed on the upper surface of the package substrate 110, and electrically connected, at least in part, using one or more bonding wire(s) 150 respectively connected to the upper connection pad(s) 115. For example, each one of the first semiconductor chip 120 and the second semiconductor chips 130 may be respectively mounted with the package substrate 110 using a wire-bonding method.

In this regard, bonding wire(s) 150 may be used to variously interconnect the second connection pad(s) 115, first chip pad(s) 125 and/or second chip pad(s) 135. In this manner, the first semiconductor chip 120 and the second semiconductor chips 130 may be electrically connected within the package substrate 110 via the bonding wires 150.

In some embodiments, the first semiconductor chip 120 may be a lowermost semiconductor chip among semiconductor chips arranged in a vertical stack. That is, the first semiconductor chip 120 may be disposed on the upper surface of the package substrate 110. For example, the first semiconductor chip 120 may include an upward-facing active surface and a downward-facing inactive surface disposed on the upper surface of the package substrate 110.

With this configuration, the active surface of the first semiconductor chip 120 may be readily connected to one or more of the second semiconductor chips 130. For example, the active surface of the first semiconductor chip 120 may include first chip pad(s) 125 that may be variously connected to one or more bonding wire(s), upper connection pad(s) 115, internal through via(s), internal wiring, etc.

When provided, one or more support member(s) 140 may be used to mechanically support one or more of the second semiconductor chips 130. In some embodiments, each support member 140 may have the same vertical "height" as the first semiconductor chip 120. In this regard, each support member 140 may include at least one of a semiconductor substrate, a metal plate, a non-metal plate, a printed circuit board and the like.

In some embodiments, one or more of the support members 140 may include one or more passive element(s), such as capacitor(s), storage device(s), inductor(s) and the like. Different types of support members 140 may be used for a variety purposes, such as signal coupling/decoupling, signal filtering, resonance attenuation, voltage or current adjustment(s), etc.

The second semiconductor chips 130 may be variously disposed on the first semiconductor chip 120 (and optionally on one or more of the support members 140). Each of the second semiconductor chips 130 may also include an upward-facing active surface and a downward-facing inactive surface. In this regard, each upward-facing active surface may include one or more second chip pad(s) 135 that may be used to readily connect circuitry in the corresponding second semiconductor chip 130.

Various combinations of the first semiconductor chip 120, the second semiconductor chips 130 and support members 140 may be variously arranged to form different vertical stacks on the package substrate 110. In some combinations, the sequentially stacked chips may be horizontally "offset" (e.g., in at least one of the X direction and the Y direction) to expose respective, active surface portions of at least the second semiconductor chips 130. For example, in the illustrated example of FIG. 1, each one of the second semiconductor devices 130a to 130h may be horizontally offset with respect to an adjacent one of the second semiconductor devices 130a to 130h. In this manner, each one of the second semiconductor chips 130a to 130h may advantageously expose one or more second chip pad(s) 135 on its active surface, such that the one or more second chip pad(s) 135 may be electrically connected to active and/or passive elements provided within the package substrate 110. Here, the number and arrangement of the second chip pad(s) 135 on the second semiconductor chips 130 is deemed to be a matter of design choice.

Relative to the illustrated example of FIG. 1, the term "active surface" of the first semiconductor chip 120 and the second semiconductor chip 130 may be understood as denoting a front surface of a semiconductor substrate, and the term "inactive surface" of the first semiconductor chip 120 and the second semiconductor chip 130 may be understood as denoting a back (or rear) surface of the semiconductor substrate. Alternately or additionally, the term active surface of the first semiconductor chip 120 and the second semiconductor chip 130 may be understood as denoting a semiconductor surface including circuitry capable of storing data and/or processing data, and the term "inactive surface" of the first semiconductor chip 120 and the second semiconductor chip 130 may be understood as denoting a semiconductor surface lacking such circuitry.

In some embodiments, each of the second semiconductor chips 130 may include at least one of a Dynamic Random Access Memory (RAM) (DRAM), a Static RAM (SRAM), flash memory, a Phase Ram (PRAM), a Resistive RAM (ReRAM), a Ferroelectric RAM (FeRAM), a Magnetic RAM (MRAM), a High-Bandwidth memory (HBM), a Hybrid Memory Cubic (HMC) and the like. However, the type, number, size, disposition and arrangement of the first semiconductor chip(s) 120 and the second semiconductor chips 130 is deemed to be a matter of design choice.

In some embodiments, the first semiconductor chip 120 and/or the support member 140 may be attached to the package substrate 110 using a first adhesive layer 122. That is, the first adhesive layer 122 may be disposed between the first semiconductor chip 120 and the package substrate 110.

A lowermost second semiconductor chip 130a among the second semiconductor chips 130 may be attached on the first semiconductor chip 120 using a second adhesive layer 132. In similar manner, vertically adjacent ones of the second semiconductor chips 130 may be attached using a corresponding second adhesive layer 132. Here, the first adhesive layer 122 and each of the second adhesive layer(s) 132 may be a non-conductive adhesive film including, for example, one or more polymer material(s) exhibiting excellent thermal conductivity, such as thermally conductive tape, thermally conductive grease, thermally conductive adhesive and the like.

The spacer 160 may be disposed on top of the chip structure CS. For example, the spacer 160 may be disposed on an uppermost adhesive layer 162 disposed between the spacer 160 and the uppermost second semiconductor chip 130h among the second semiconductor chips 130. Here, the spacer 160 may include a lower surface facing the top of the chip structure CS and an upper surface opposing the lower surface. In this regard, the spacer 160 may be disposed on top of the chip structure CS to prevent (or better resist) cracking in the upper material layers and components of the chip structure CS. In some embodiments, one side surface of the spacer 160 may be vertically aligned with one side surface of the uppermost second semiconductor chip 130h, but the inventive concept is not limited thereto.

Thus, in some embodiments, the spacer 160 may be disposed on the uppermost second semiconductor chip 130h using an uppermost adhesive layer 162. That is, the uppermost adhesive layer 162 may be disposed between an upper surface of the uppermost second semiconductor chip 130h and the lower surface of spacer 160. The upper adhesive layer 162 may be a non-conductive adhesive film similar to the first adhesive layer 122 and/or the second adhesive layer 132.

In some embodiments, the spacer 160 may include a material having a color different from the color of the encapsulant 170. Accordingly, since the spacer 160 is differently colored than the encapsulant 170, the marking pattern MP may be readily identified by selectively exposing a portion of the upper surface of the spacer 160.

For example, the spacer 160 may include a silicon layer (e.g., at least one of monocrystalline silicon, polycrystalline silicon, amorphous silicon, single crystal gallium arsenide, polycrystalline gallium arsenide, amorphous gallium arsenide, a polyimide (PI), etc.

A first thickness t1 of the spacer 160 may range from between about 20 µm to about 100 µm. More particularly, the first thickness t1 of the spacer 160 may range from between about 20 µm to about 70 µm. Alternately, the first thickness t1 of the spacer 160 may range from between about 80% to about 120% of the thickness of the uppermost second semiconductor chip 130h. In this regard, it has been noted that if the first thickness t1 of the spacer 160 is less than the foregoing ranges, it is difficult to prevent cracking in the upper material layers/components of the chip structure CS. However, when the first thickness t1 of the spacer 160 is greater than the foregoing ranges, a distance (shown in FIG. 1) from the uppermost adhesive layer 162 to an uppermost surface of the encapsulant 170 becomes so thick that miniaturization of the semiconductor package 100A becomes difficult.

In this regard, the encapsulant 170 may be disposed on the package substrate 110 to encompass at least part of the chip structure CS and at least part of the spacer 160.

In the illustrated example of FIGS. 1 and 2, at least one opening OP may be formed in the encapsulant 170 to penetrate an upper portion 170u of the encapsulant 170 to selectively expose portions of the spacer 160. Here, the upper portion 170u of the encapsulant 170 may have a second thickness t2, and may constitute the portion of the encapsulant 170 covering at least part of the spacer 160. For example, in some embodiments, the opening OP may be formed through the upper portion 170u of the encapsulant 170 using a laser which may also be used in the marking process. This approach will be described in some additional detail with reference to FIG. 9.

Hence, a depth of the opening OP may be substantially equal to the second thickness t2 of the upper portion 170u of the encapsulant 170. For example, the depth of the opening OP may be referred to as a "marking depth" corresponding to a height of the upper portion 170u of the encapsulant removed during the marking process. (See. e.g., the description hereafter in relation to FIG. 9).

The second thickness t2 of the upper portion 170u of the encapsulant 170 disposed above the spacer 160 may range from between about 20 µm to about 70 µm. Alternately, the second thickness t2 of the upper portion 170u of the encapsulant 170 may range from between about 50% to about 150% of the first thickness t1 of the spacer 160. More particularly, in some embodiments, the second thickness t2 of the upper portion 170u of the encapsulant 170 may range from between about 75% to about 125% of the first thickness t1 of the spacer 160.

Since the opening OP should fully penetrate the upper portion 170u of the encapsulant 170 to selectively expose portions of the upper surface of the spacer 160 to form the marking pattern MP, the upper portion 170u of the encapsulant 170 should be relatively thin. Accordingly, the size of a filler included in the encapsulant 170 will not materially affect the marking depth of the encapsulant 170 removed during the marking process. For example, since the spacer 160 is disposed between the uppermost surface of the chip structure CS and the opening OP selectively forming the marking pattern MP, the second thickness t2 of the upper portion 170u of the encapsulant 170 may be less than or equal to about 70 µm.

In this regard, the distance 'd' from an uppermost surface of the chip structure CS to the uppermost surface of the encapsulant 170 may be less than or equal to about 150 µm. In some embodiments, the distance 'd' from the uppermost second semiconductor chip 130h to an uppermost end of the encapsulant 170 may range from between about 40 µm to about 150 µm. In other embodiments, the distance 'd' from the uppermost second semiconductor chip 130h to an uppermost end of the encapsulant 170 may range from between about 40 µm to about 140 µm.

The encapsulant 170 includes one or more insulating material(s), such as an epoxy molding compound (EMC), wherein the epoxy molding compound (EMC) may include at least one resin and at least one filler, such as carbon black.

It follows that the marking pattern MP may be variously formed by creating one or more opening(s) through the upper portion 170u of the encapsulant 170 to selectively expose portions of the upper surface of the spacer 160. And since the spacer 160 is disposed between the chip structure CS and the encapsulant 170 when the marking pattern MP is formed, the risk of damage in any one of the material layers/components in the chip structure is extremely low.

Further, since the spacer 160 and the encapsulant 170 have different colors, the marking pattern MP may be readily identified even if the second thickness t2 of the upper portion 170u of the encapsulant 170 is not uniform. For example, assuming that the second thickness t2 of the upper portion 170u of the encapsulant 170 is about 70 µm or less, the distance 'd' from the uppermost second semiconductor chip 130h to the uppermost end of the encapsulant 170 may be about 150 µm or less.

FIGS. 4, 5, 6, 7, and 8 are respective, cross-sectional diagrams illustrating in several examples semiconductor packages according to embodiments of the inventive concepts. The descriptions that follow are drawn in comparison with the semiconductor package 100A of FIG. 1, therefore only material difference(s) will be emphasized.

Figure 4:
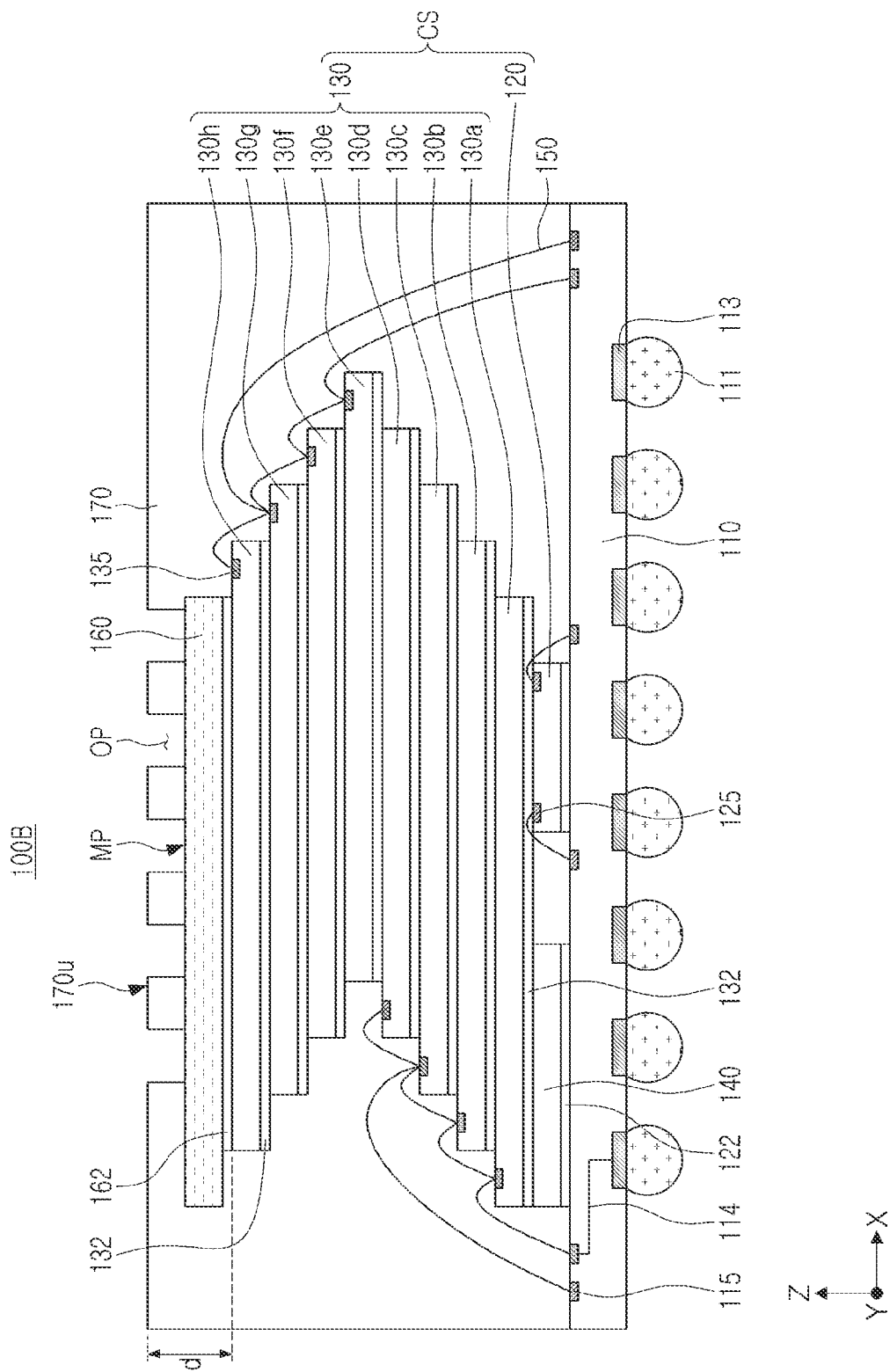
FIGS. 4, 5, 6, 7, and 8 are respective cross-sectional diagrams illustrating in various examples semiconductor packages according to embodiments of the inventive concept.

Referring to FIG. 4, in a semiconductor package 100B, one end of the spacer 160 extends beyond the corresponding end of the uppermost second semiconductor chip 130h. Thus, one side surface of the spacer 160 is not vertically aligned with one side surface of the uppermost second semiconductor chip 130h, but instead outwardly extends (e.g., in the X direction) beyond the one side surface of the uppermost second semiconductor chip 130h.

Figure 5:
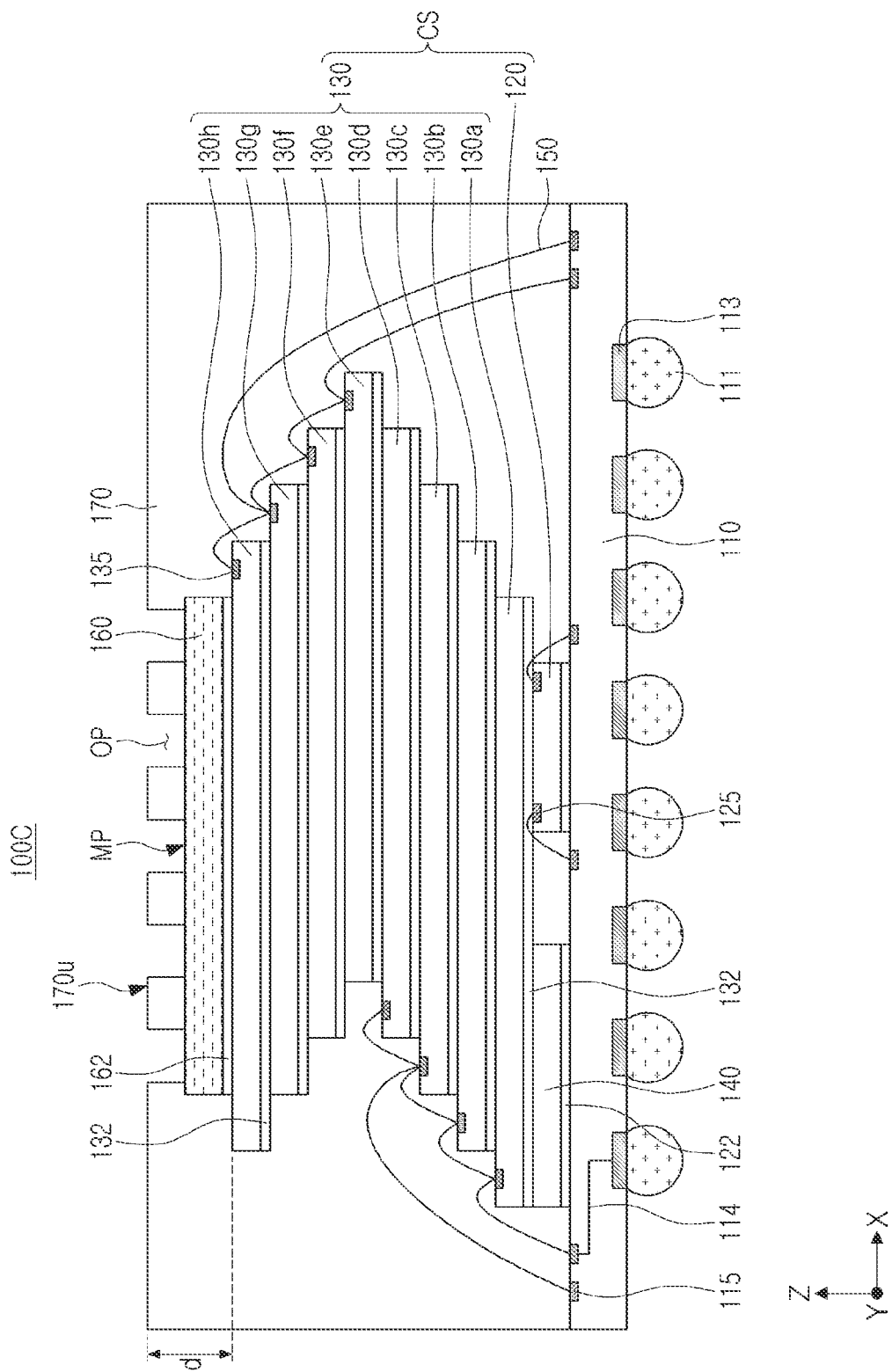

Referring to FIG. 5 a semiconductor package 100C may include the spacer 160 having a lateral width (e.g., in the X direction) less than a lateral width of the uppermost second semiconductor chip 130h, such that neither side surface of the spacer 160 is vertically aligned with a corresponding side surface of the uppermost second semiconductor chip 130h. Instead, the spacer 160 may be centrally disposed on the uppermost second semiconductor chip 130h, such that each side surface of the uppermost second semiconductor chip 130h outwardly extends beyond a corresponding side surface of the spacer 160.

Figure 6:
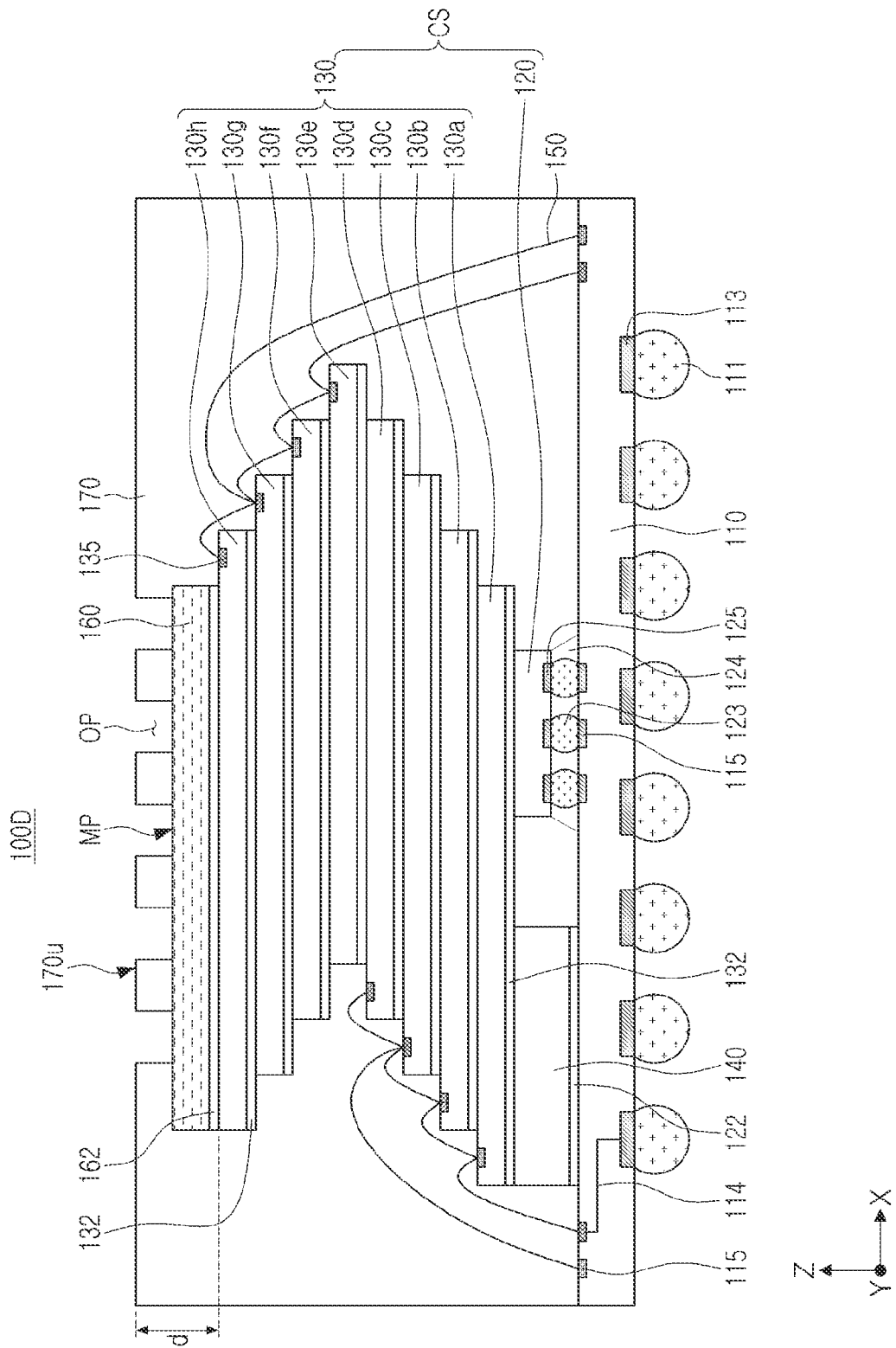

Referring to FIG. 6, a semiconductor package 100D may include additionally include a connection member 123 disposed between the package substrate 110 and the chip structure CS, as well as an underfill resin 124.

Here, as before, the first semiconductor chip 120 may be disposed at a lowermost position within the chip structure CS and adjacent to the upper surface of the package substrate 110. However, in contrast to the embodiment of FIG. 1, a downward-facing active surface of the first semiconductor chip 120 may be positioned proximate to the upper surface of the package substrate 110, and an upward-facing inactive surface of the first semiconductor package 120 may be attached to the lowermost second semiconductor chip 130a using (e.g.) the second adhesive layer 132.

With this configuration, the first chip pad(s) 125 may be disposed on the lower surface of the first semiconductor chip 120, and used to electrically connect (e.g.) various second connection pad(s) 115 disposed on the package substrate 110. For example, the first semiconductor chip 120 may be mounted on the package substrate 110 using the connection member 123 disposed on the first chip pads 125 using (e.g.) a flip-chip bonding method.

Here, the connection member 123 may include conductive pads, solder ball(s), copper pillar(s), etc. Additionally, the underfill resin 124 (e.g., an epoxy resin) may be provided to substantially surround side surfaces of the connection members 123 between the active surface of the first semiconductor chip 120 and the upper surface of the package substrate 110.

Figure 7:
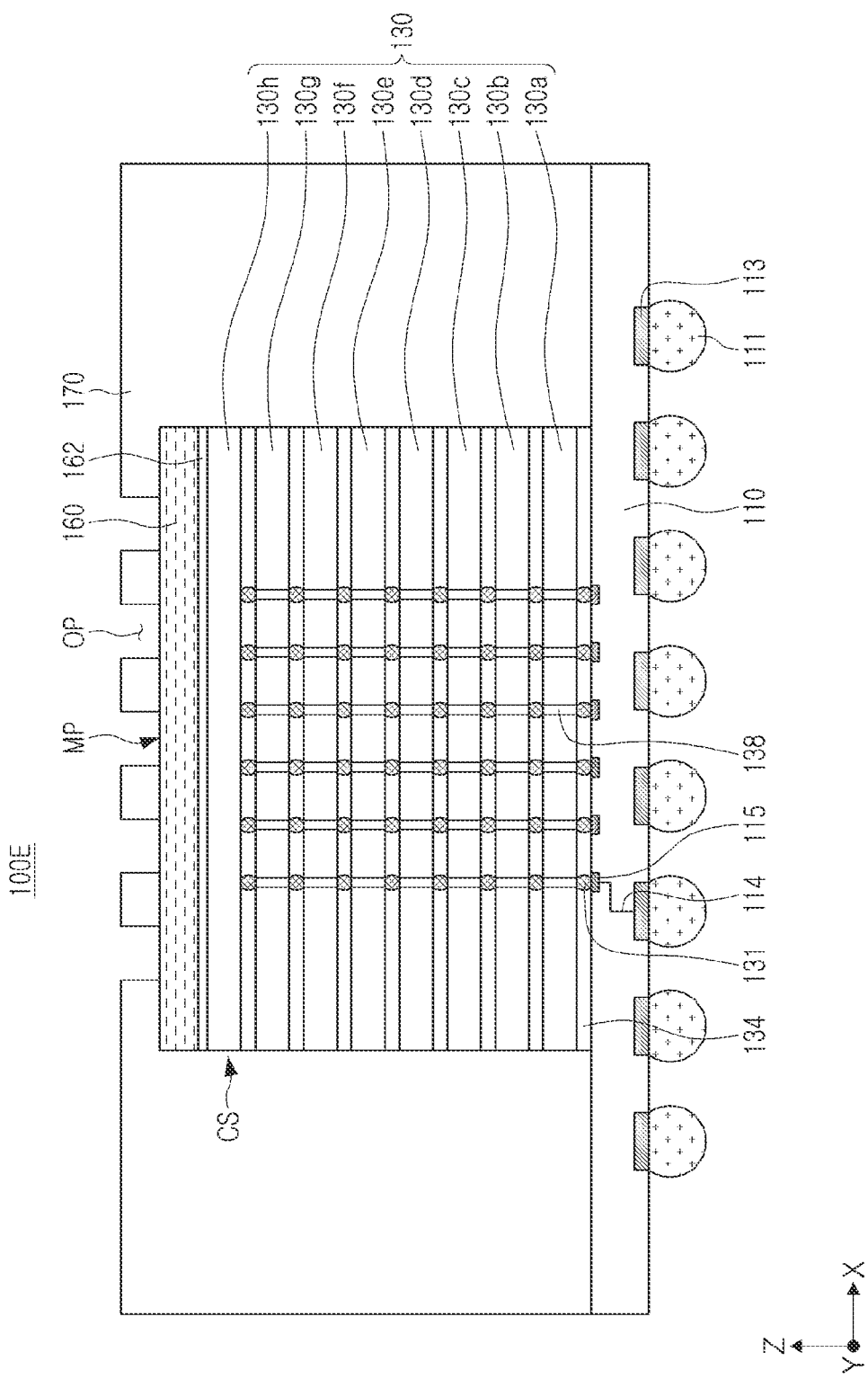

Referring to FIG. 7, a semiconductor package 100E may include conductive bump(s) respectively disposed between the lowermost semiconductor chip 130a and the package substrate 110, and/or between vertically adjacent ones of the semiconductor chips 130 (e.g., 130b, 130c, 130d, 130e, 130f, 130g and 130h). In this regard, the conductive bumps 131 may be variously arranged to facilitate electrical interconnections between the semiconductor chips 130 in the chip structure CS. Each of the conductive bumps 131 may include, for example, a conductive pad, a solder ball and/or a copper pillar.

Additionally or alternately, a number of through electrodes 138 may be provided to additionally facilitate electrical interconnections between the semiconductor chips 130 in the chip structure CS. Here, each of the through electrodes 138 may penetrate through one or more of the semiconductor chips 130 to variously connect one or more of the conductive bumps 131 or selected circuitry respectively provided by one or more of the semiconductor chips 130.

In some embodiments, consistent with the illustrated example of FIG. 7, the side surfaces for all of the semiconductor chips 130 may be vertically aligned.

In some embodiments, side surfaces of the spacer 160 may also be vertically aligned with side surfaces of the semiconductor chips 130. Thus, the spacer 160 may have substantially the same planar area as each one of the semiconductor chips 130.

Respective material layers may be formed between vertically adjacent semiconductor chips 130 that include (e.g.) the underfill resin 134, and may be provided to substantially surround the side surfaces of the conductive bumps 131.

Figure 8:
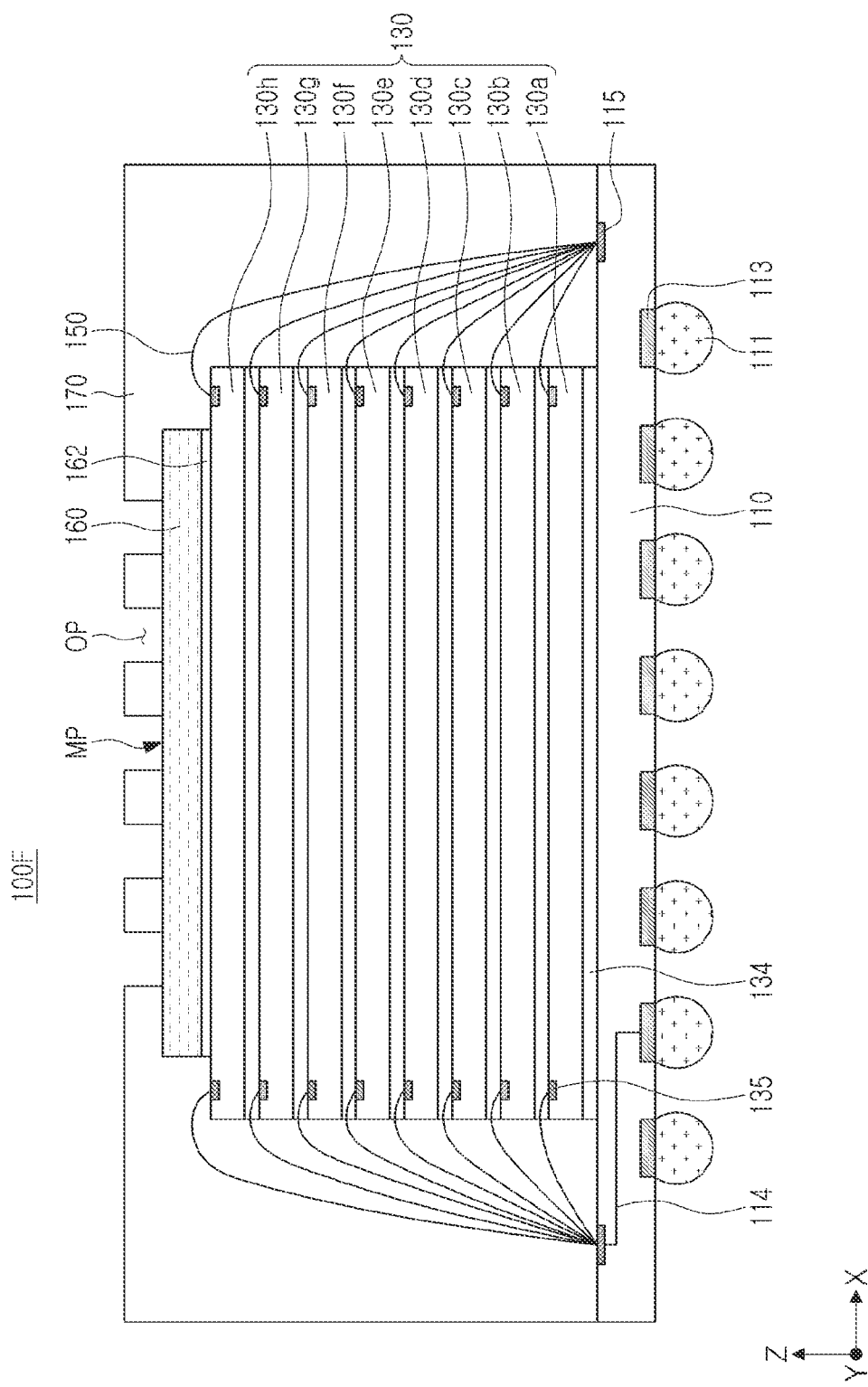

Referring to FIG. 8, a semiconductor package 100F may include vertically aligned, and vertically stacked semiconductor chips 130 within the chip structure CS. Thus, respective side surfaces of the semiconductor chips 130 are substantially aligned in the same vertical plane.

In some embodiments consistent with FIG. 8, at least one of the semiconductor chips 130 may be a memory chip, such as DRAM, SRAM, flash memory, PRAM, ReRAM, FeRAM, and MRAM, HBM, HMC, and/or the like.

In contrast, the spacer 160 may have a planar area less than each one of the semiconductor chips 130 such that at least one end portion of the upper surface of the uppermost semiconductor chip 130h is exposed. In some embodiments, the at least one end portion of the upper surface of the uppermost semiconductor chip 130h may include a second chip pad 135.

FIG. 9, inclusive of FIGS. 9(a), 9(b), 9(c) and 9(d), is a cross-sectional view illustrating in one example a marking process that may be used in conjunction with certain semiconductor packages according to embodiments of the inventive concept.

Referring to FIGS. 1, 2, 3 and 9, a marking process may be used to (1) form the opening OP in the upper portion 170u of the encapsulant 170; and (2) create a desired marking pattern. These two objectives may be efficiently accomplished by selectively irradiating portion(s) of the upper portion 170u of the encapsulant 170 with a laser.

As shown in FIG. 9(a), a laser 200 (e.g., an infrared laser) may selectively irradiate a portion of the encapsulant 170 with a laser beam 201 (an infrared light beam).

As shown in FIG. 9(b), the encapsulant 170 will absorb electromagnetic energy from the laser beam 201 and convert the energy into heat. As noted above, in some embodiments, the encapsulant 170 may include a resin (e.g., an epoxy resin) 171 and a filler 173 (e.g., carbon black).

Accordingly, as shown in FIG. 9(c), the filler 173 may be bleached (e.g., become relatively more transparent) by the absorbed energy, and the resin 171 may be melted away or vaporize by the heat of the absorbed energy.

Thereafter, as shown in FIG. 9(d), the irradiated portion of the encapsulant 170 may be removed, thereby selectively exposing portions of the upper surface of the spacer 160 and generating a high identifiable marking pattern MP.

Here, it should again be noted that were the spacer 160 absent from the top of the chip structure CS, it would be very difficult to generate the marking pattern with a fully useful marking depth (e.g., substantially equal to the second thickness t2 (or height) of the encapsulant 170) due to (e.g.) particle(s) of certain size in the filler 173. Therefore, by introducing the spacer 160, irradiated portions of the encapsulant 170 having a first color may be safely and fully (or near fully) removed to selectively expose portions of the upper surface of the spacer 160 having a second color, different from the first color. In order to accomplish this outcome, the thickness of the encapsulant 170 and particularly the thickness of the upper portion 170u of the encapsulant 170 should be appropriately defined, as described above, such that the marking depth is not insufficient to provide a clearly identifiable marking pattern MP.

Further, as noted above, the material(s) forming the encapsulant 170 and the material(s) forming the spacer 160 may be selected in such a manner that the encapsulant 170 and the spacer 160 have visually discernable different colors.

Embodiments of the inventive concept provide semiconductor packages including a spacer disposed on top of a chip structure in order to prevent cracking material layers/components of an uppermost semiconductor chip in the chip structure. Embodiments of the inventive concept also provide semiconductor packages having a marking pattern formed by selectively exposing an upper surface of the spacer through an upper portion of an encapsulant, thereby allowing the chip structure to have a relatively thin vertical profile.

As used herein the term "connection" denotes both a direct connection of one component to another component, as well as an indirect connection through an intermediating material layer or components (e.g., an adhesive layer).

While embodiments of the inventive concept have been shown and described above, it will be apparent to those skilled in the art that modifications and variations could be made to these embodiments without departing from the scope of the inventive concept, as defined by the following claims.

What is claimed is:

1. A semiconductor package, comprising:
   a package substrate;
   a chip structure including vertically stacked semiconductor chips disposed on the package substrate;
   a spacer disposed on an uppermost semiconductor chip among the semiconductor chips;
   an encapsulant covering at least part of the chip structure, and including an upper portion of the encapsulant covering at least part of the spacer; and
   a marking pattern visually identifiable through an opening in the upper portion of the encapsulant selectively exposing portions of the spacer,
   wherein the spacer includes at least one of monocrystalline silicon, polycrystalline silicon, amorphous silicon, monocrystalline gallium arsenide, polycrystalline gallium arsenide and amorphous gallium arsenide.

2. The semiconductor package of claim 1, wherein the encapsulant includes at least one material having a first color, and the spacer includes at least one material having a second color different from the first color.

3. The semiconductor package of claim 1, wherein the spacer has a first thickness, the upper portion of the encapsulant has a second thickness, and the opening has a depth substantially equal to the second thickness.

4. The semiconductor package of claim 3, wherein the first thickness ranges from between about 20 μm to about 100 μm.

5. The semiconductor package of claim 3, wherein the first thickness ranges from between about 80% to about 120% of the second thickness.

6. The semiconductor package of claim 3, wherein the second thickness ranges from between about 20 μm to about 70 μm.

7. The semiconductor package of claim 3, wherein the second thickness ranges from between about 50% to about 150% of the first thickness.

8. The semiconductor package of claim 1, wherein a distance from an upper surface of the uppermost semiconductor chip to an uppermost surface of the encapsulant ranges from between about 40 μm to about 150 μm.

9. The semiconductor package of claim 1, wherein the encapsulant includes an epoxy molding compound.

10. The semiconductor package of claim 9, wherein the epoxy molding compound including at least one resin and carbon black.

11. The semiconductor package of claim 1, further comprising:
    upper connection pads disposed on an upper surface of the package substrate;
    chip pads disposed on an active surface of at least one of the semiconductor chips; and
    bonding wires electrically connecting at least one of the upper connection pads to at least one of the chip pads.

12. The semiconductor package of claim 1, further comprising:
    an upper adhesive layer disposed between the uppermost semiconductor chip and the spacer.

13. The semiconductor package of claim 1, wherein each of the semiconductor chips includes an active surface and an inactive surface,
    the active surface of a lowermost semiconductor chip among the semiconductor chips is connected to connection pads disposed on an upper surface of the package substrate via a connection member; and
    an underfill resin substantially covering side surfaces of the connection member.

14. The semiconductor package of claim 1, further comprising:
    upper connection pads disposed on an upper surface of the package substrate;
    chip pads disposed on an active surface of at least one of the semiconductor chips; and bonding wires electrically connecting at least one of the upper connection pads to at least one of the chip pads, wherein each of the semiconductor chips includes an upward-facing active surface and a downward-facing inactive surface.

15. A semiconductor package, comprising:
a package substrate;
a support member disposed on the package substrate;
a chip structure including a first semiconductor chip disposed on the package substrate, and second semiconductor chips vertically stacked on at least one of the first semiconductor chip and the support member;
a spacer disposed on an uppermost second semiconductor chip among the second semiconductor chips;
an encapsulant covering at least part of the chip structure, and including an upper portion of the encapsulant covering at least part of the spacer; and
a marking pattern visually identifiable through an opening in the upper portion of the encapsulant selectively exposing portions of the spacer,
wherein a distance from an uppermost surface of the chip structure to an uppermost surface of the encapsulant ranges from between about 40 μm to about 150 μm, and the spacer comprises silicon.

16. The semiconductor package of claim 15, wherein a thickness of the spacer ranges from between about 20 μm to about 100 μm.

17. The semiconductor package of claim 15, wherein a thickness of the spacer ranges from between about 80% to about 120% of a thickness of the uppermost second semiconductor chip.

18. The semiconductor package of claim 15, wherein at least one of the second semiconductor chips is a memory chip.

19. A semiconductor package, comprising:
a package substrate;
a chip structure including vertically stacked semiconductor chips disposed on the package substrate;
a spacer disposed on the chip structure, and including a first surface facing the chip structure, and a second surface opposing the first surface;
an upper adhesive layer between the first surface of the spacer and an upper surface of an uppermost semiconductor chip among the semiconductor chips;
an encapsulant covering at least part of the chip structure, and including an upper portion of the encapsulant covering at least part of the spacer; and
a marking pattern visually identifiable through an opening in the upper portion of the encapsulant selectively exposing portions of the second surface of the spacer,
wherein the spacer includes a silicon layer, and
the encapsulant includes a resin and a filler.

* * * * *